United States Patent [19]

Uno et al.

[11] Patent Number: 4,755,015

[45] Date of Patent: Jul. 5, 1988

[54] MONOLITHIC INTEGRATED SEMICONDUCTOR DEVICE OF SEMICONDUCTOR LASER AND OPTICAL WAVEGUIDE

[75] Inventors: Tomoaki Uno, Hirakata; Mototsugu Ogura, Takaichi, both of Japan

[73] Assignee: Matsushita Electric Industrial Co., Ltd., Osaka, Japan

[21] Appl. No.: 884,621

[22] Filed: Jul. 11, 1986

[30] Foreign Application Priority Data

Jul. 12, 1985 [JP] Japan ................................ 60-154582

[51] Int. Cl.⁴ .............................................. G02B 6/10
[52] U.S. Cl. ............................ 350/96.12; 350/96.11; 372/45; 372/46; 372/50
[58] Field of Search ............... 350/96.11, 96.12, 96.13, 350/96.14, 96.34; 372/45, 46, 50

[56] References Cited

U.S. PATENT DOCUMENTS 4,464,762  8/1984  Furuya ........................ 350/96.11 X
4,594,603  6/1986  Holonyak, Jr. .................. 372/45 X

FOREIGN PATENT DOCUMENTS 53-46711  12/1978  Japan ................................ 372/45

Primary Examiner—John Lee
Assistant Examiner—Michael Menz
Attorney, Agent, or Firm—Wenderoth, Lind & Ponack

[57] ABSTRACT

A semiconductor device which includes a semiconductor substrate, an active layer in a quantum well structure disposed on said semiconductor substrate, an optical waveguide formed by a disordering part of said active layer, and a clad layer disposed on said active layer and optical waveguide. As a result of this structure, the coupling efficiency of the active layer and optical waveguide is extremely enhanced, and a high performance semiconductor device is obtained.

6 Claims, 6 Drawing Sheets

MONOLITHIC INTEGRATED SEMICONDUCTOR DEVICE OF SEMICONDUCTOR LASER AND OPTICAL WAVEGUIDE

BACKGROUND OF THE INVENTION

This invention relates to a semiconductor device and method of fabricating the same, and more particularly to a monolithic integrated semiconductor device of a semiconductor laser and optical waveguide and a method of fabricating the same.

Along with the recent development in the field of optical communications and optical information processing, there is a mounting demand for a semiconductor device in such a construction so as to couple the output light of a semiconductor laser with the optical waveguide at high efficiency. Principal applications of this semiconductor device are, firstly, the use in a so-called monolithic OEIC (opto-electronics integrated circuit) which guides the output light from the semiconductor laser in the same semiconductor substrate as the semiconductor laser, and performs such operations as modulation, switching and opto-electric conversion, and, secondly, the use in a so-called optical feedback laser which guides the output light from the semiconductor laser into the optical waveguide and feeds back to the semiconductor laser so as to stably unify the oscillation wavelength of the semiconductor laser and reduce the spectral linewidth.

Conventionally, as the coupling method of this kind of semiconductor laser and optical waveguide on a same semiconductor substrate, a method called a butt-joint process has been widely employed. (For example, it was reported at the General Meeting of the Institute of Electronics and Communication Engineers of Japan in 1982, Proceedings 4-42.)

In this conventional butt-joint semiconductor device, since the active layer and optical waveguide layer of the semiconductor laser were fabricated by different epitaxial crystal growths, that is, by performing crystal growth twice, the process was inevitably accompanied by a uneven film thickness or a film thickness control error due to etching controllability or an epitaxial crystal growth operation, bringing about axial deviation of the light guided between the active layer and optical waveguide layer, and the light coupling efficiency was notably decreased, making it difficult to achieve the intended characteristics. Besides, the thus fabricated semiconductor devices were not uniform in quality, which was a serious industrial problem. Concerning such significant decrease of light coupling efficiency due to axial deviation, for example, results of analysis were reported at the General Meeting of the Institute of Electronics And Communication Engineers of Japan in 1982, in Proceedings 4-43, in which it was disclosed that the coupling efficiency is extremely lowered by a very slight axial deviation, film thickness unevenness, or film thickness control error of even less than 1 μm.

SUMMARY OF THE INVENTION

It is hence a primary object of this invention to present a semiconductor device in a construction wherein the active layer and optical waveguide are coupled together at high efficiency without causing axial deviation of the film thickness deviation.

It is another object of this invention to present a method of easily fabricating a semiconductor device in a construction wherein the active layer and optical waveguide are coupled together at high efficiency.

These and other objects are accomplished by a semiconductor device according to the invention, of which semiconductor device includes a semiconductor substrate, an active layer of a quantum well structure disposed on said semiconductor substrate, an optical waveguide formed by disordering part of said active layer, and a clad layer disposed on said active layer and optical waveguide.

In a first illustrative embodiment, disordering is effected by doping of impurities at high concentration or by local annealing. In a second illustrative embodiment, a semiconductor layer is formed on said semiconductor substrate, and the active layer is formed on this semiconductor layer. In a third illustrative embodiment, a grating is formed at least in the portion corresponding to said optical waveguide on the surface of said semiconductor layer. In a fourth illustrative embodiment, a grating may be also formed at least in a portion other than the area corresponding to said optical waveguide on the surface of said semiconductor layer. In a fifth illustrative embodiment, a reflection layer to feed back the output light from the active layer to the active layer is provided at a different end of the optical waveguide from the end contacting with the active layer. In a sixth illustrative embodiment, said reflection layer is a multilayer structure of dielectric layers, or a multilayer structure of dielectric layers and metal layers. In a seventh illustrative embodiment, said active layer is an active layer of a distributed feedback type laser or a distributed reflection type laser. In an eighth illustrative embodiment, said semiconductor substrate is of p-type. In a ninth illustrative embodiment, a GaAs/AlGaAs material is used as semiconductor material. In a tenth illustrative embodiment an, InP/InGaAsP material may be also used as a semiconductor material.

According to the present invention as described herein, the following benefits, among others, are obtained:

(1) Since the optical waveguide is formed by disordering part of the active layer, axial deviation between the active layer and the optical waveguide is completely eliminated, so that the both can be coupled at high efficiency.

(2) The active layer and optical waveguide may be easily fabricated by sequentially forming the first, second and third semiconductor layers on the semiconductor substrate, and disordering part of the second semiconductor layer.

While the novel features of the invention are set forth with particularly in the appended claims, the invention, both as to organization and content, will be better understood and appreciated, along with other objects and features thereof, from the following detailed description taken in conjunction with the drawings, in which:

DETAILED DESCRIPTION OF THE INVENTION

Figure 1:
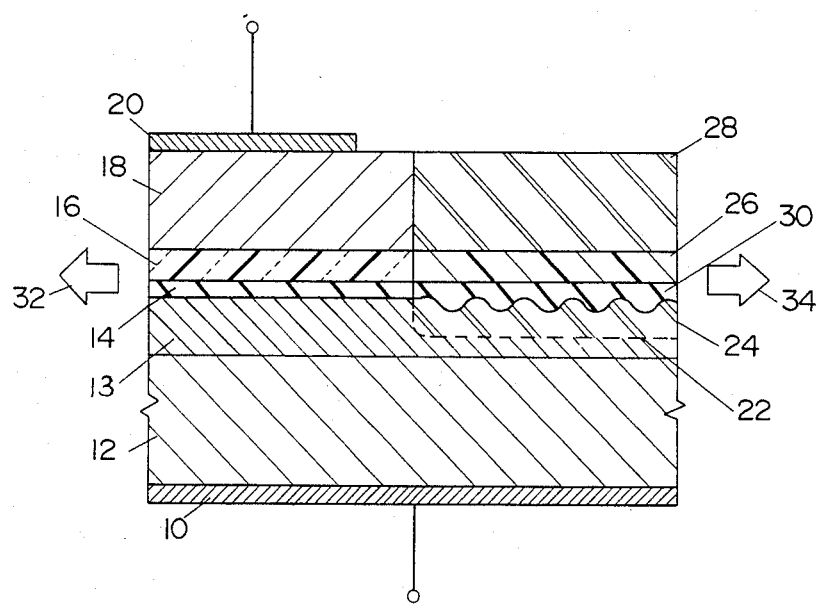
FIG. 1 is a sectional view of a semiconductor device in a first embodiment of this invention.

A semiconductor device in a first embodiment of this invention is described below while referring to FIG. 1 to FIG. 5. FIG. 1 is a sectional view of a distributed reflection type laser of this embodiment. In this example, an InP/InGaAsP material is used as semiconductor material. In FIG. 1, numeral 10 is an Au/Zn electrode, 12 is a P+-InP substrate, 13 is a P+-InP buffer layer, 14 is a P+-InGaAsP ($\lambda g = 1.35$ μm), 16 is a multiquantum well (MQW) active layer with the wavelength between minimum quantum levels of $\lambda g = 1.55$ μm, 18 is an N+-InP clad layer, 20 is an Au/Sn electrode, 22 is an impurity diffusion front, 24 is a grating of which period is about 0.24 μm, 26 is a waveguide layer formed by disordering the same MQW layer as the active layer 16 by high concentration impurity diffusion, 28 is a clad layer having impurity diffusion disposed in the same N+-InP layer as the clad layer 18, 30 is a waveguide layer having impurity diffusion disposed in the same layer as the waveguide layer 14, and 32, 34 are output lights of the laser.

Figure 2:
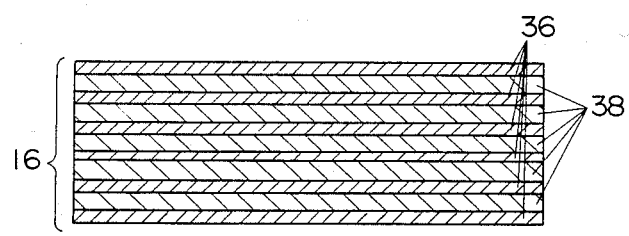
FIG. 2 is a magnified sectional view of the active layer part of the same device.

FIG. 2 is a magnified sectional view of the MQW active layer 16, in which N-InP layer 36 and N-InGaAsP 38 are periodically laminated to make up the MQW active layer 16.

Figure 3:
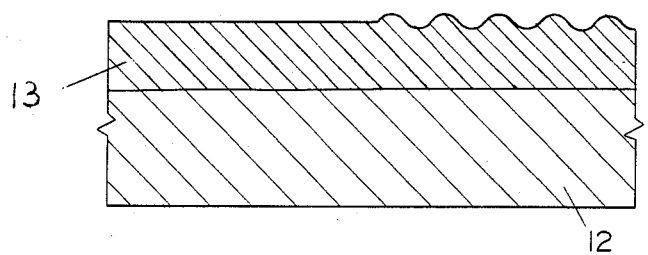
FIG. 3, FIG. 4 are process charts illustrating the fabricating method of the device of the first embodiment.
Figure 4:
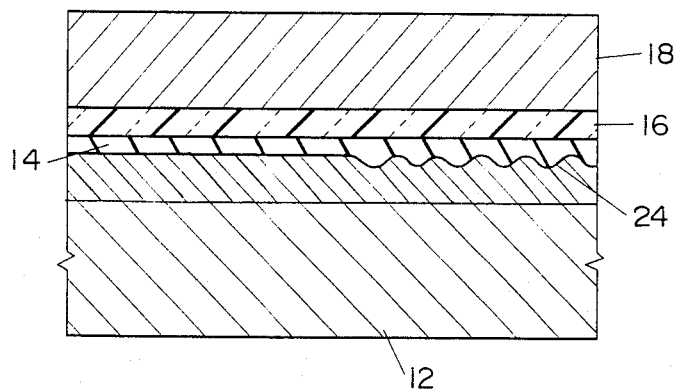

The outline of the method of fabricating this semiconductor device is sequentially explained by referring to FIG. 3 and FIG. 4. First, as shown in FIG. 3, a grating 24 is formed on the P+-InP buffer layer 13 at a specified position which layer is crystal-grown on the substrate 12 by a lithographic technique. Then, as shown in FIG. 4, waveguide layer 14, MQW active layer 16, and clad layer 18 are developed on the entire surface of the substrate 12 by epitaxial growth. The P+-InP buffer layer 13 is one which can relieve defects which occur in the substrate 10. It is possible to eliminate the buffer layer in order to reduce the number of steps for fabricating the device, by using a substrate of low dislocation. The method of this epitaxial growth is not particularly specified, and may include liquid phase epitaxy (LPE), vapor phase epitaxy (VPE), molecular beam epitaxy (MBE), metal organic-vapor phase epitaxy (MO-VPE), or any other method. Next, in the position including the region for forming waveguide layer 26, Zn is diffused as an impurity at high concentration by thermal diffusion in the vapor phase. At this time, the same layer as the MQW active layer 16 is disordered by the impurity diffusion to become a waveguide layer 26. Finally, after forming stripes and burying the portion including the MQW active layer 16 and waveguide layer 26 by the conventional buried heterostructure (BH) layer forming technology, the fabrication is finished by forming electrodes 10, 20 at specified positions.

The light emitted from the MQW active layer 16 by injecting an electric current into the gap between the electrodes 10, 20 is led into the waveguide layers 26, 30, and is reflected by the grating, and is fed back again to the MQW active layer 16, thereby causing laser oscillation. Here, the conventional problem of decrease of light coupling efficiency between the waveguide layer and active layer is completely solved because, in this embodiment, the MQW active layer 16 and waveguide layer 26 are made of the same crystal growth layer and axial deviation of the guided light does not occur, so that a high light coupling efficiency may be obtained.

Figure 5:
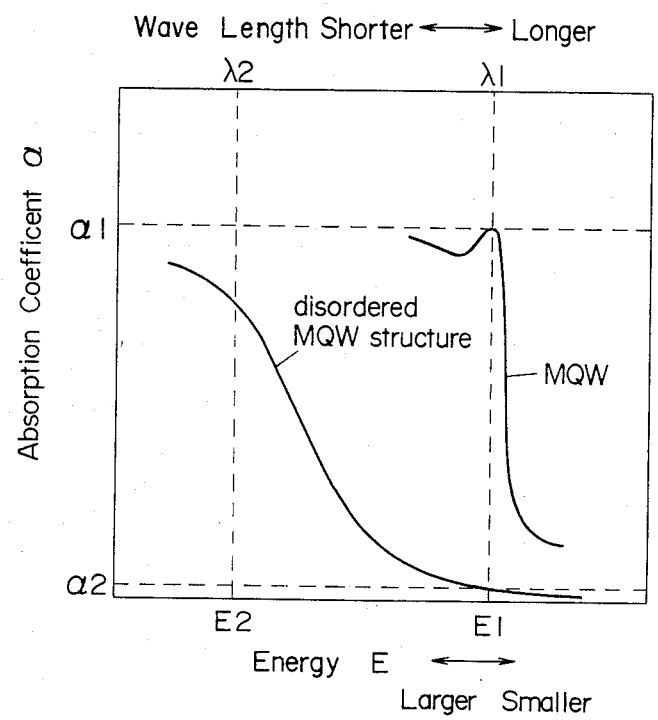
FIG. 5 shows an energy-absorption coefficient curve to explain the principle of this invention.

Referring now to FIG. 5, the absorption loss of the waveguide 26 is explained below. FIG. 5 shows the absorption coefficient (on the axis of ordinates) of the MQW active layer 16 and the waveguide layer 26 formed by disordering the same MQW layer as the MQW active layer by high concentration impurity diffusion, in terms of the energy of light (on the axis of abscissas). Laser oscillation occurs in the vicinity of the energy $E_1$ between the lowest quantum levels of the MQW active layer 16, and with respect to this wavelength of $\lambda_1$, the absorption coefficient of the waveguide is $\alpha_2$, which is far smaller than the absorption coefficient $\alpha_1$ of the MQW active layer, indicating that the loss as waveguide is extremely small.

Here, the band gap of the crystal in the composition of $In_{(1-x)}Ga_xAs_yP_{(1-y)}$ is given in the following equation:

$$Eg(eV) = 1.35 + 1.40x - y - 0.33xy - (0.758 - 0.298y)$$
$$x(1-x) - (0.101 + 0.109x)y(1-y)$$

The band gap of the disordered waveguide 26 is, in the MQW structure in FIG. 2, determined from the composition ratio x, y when the InP barrier layer 36 and InGaAsP well layer 38 are mixed homogeneously. From this band gap, the absorption curve of the MQW structure disordered in FIG. 5 may be predicted. Generally, when the thickness of the barrier layer 36 is greater, the value of the absorption coefficient $\alpha_2$ of the waveguide with respect to the laser oscillation wavelength may be smaller, so that the waveguide loss may be further smaller. Furthermore, in this embodiment, since another waveguide layer 30 is added, the effect to reduce the waveguide loss of light may be further expected.

Figure 6:
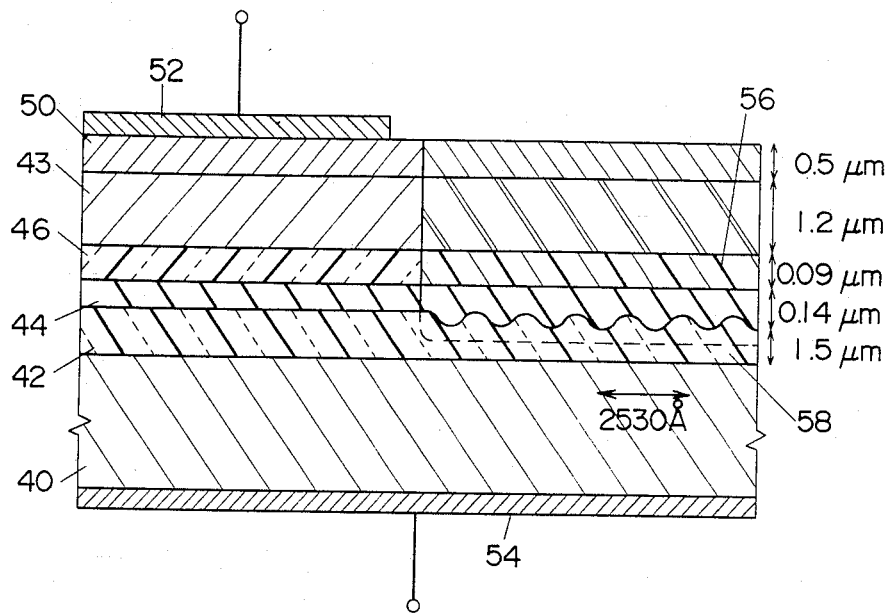
FIG. 6 is a sectional view of a semiconductor device in a second embodiment of this invention.
Figure 7:
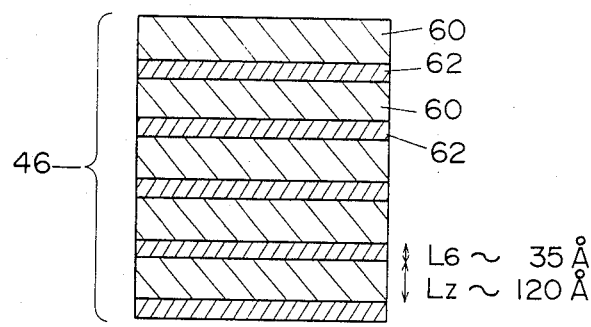
FIG. 7 is a magnified sectional view of the active layer part of the same device.

Referring then to FIG. 6 and FIG. 7, a semiconductor device in a second embodiment of this invention is described herein. The device of this second embodiment is basically the same as that of the first embodiment, except that the GaAs/AlGaAs material is used as a semiconductor material. In FIG. 6, a P+-$Al_{0.4}Ga_{0.6}As$ layer 42 is formed as a cladding layer having the function of a buffer layer on a P+GaAs substrate 40. On this layer 42 is formed a P-$Al_{0.13}Ga_{0.87}As$ layer 44 as a first waveguide layer, and further on it are formed an MQW layer 46, and an n-$Al_{0.4}Ga_{0.6}As$ layer 48 and an n+-GaAs layer 48 as clad layers. On the upper and lower faces of this laminate structure, Au/Ge/Ni electrode 52 and Au/Zn electrode 54 are disposed. Besides, similar to the foregoing embodiment 1, Zn is diffused as a high concentration impurity in the right half of this laminate structure, and the right half of the MQW layer 46 is disordered to be a second waveguide layer 56. In the right half of the first waveguide layer 42, a grating 58 of which period is about 0.253 μm is formed. The MQW layer 46 is a five-ply laminate structure of an GaAs layer 60 and an $Al_{0.2}Ga_{0.8}As$ layer 62 as shown in FIG. 7. The wavelength between the lowest quantum levels of MQW layer $\lambda g$ is 8600 Å. Incidentally, the band gap of the crystal in this $Al_xGa_{(1-x)}As$ composition is given in the following equation.

$$Eg(eV) = 1.424 + 1.247x + 1.147(x-0.45)^2$$

The band gap of the disordered waveguide layer 56 is determined from the composition ratio x when the MQW layer is homogeneously blended with the AlGaAs barrier layer 62 and the GaAs well layer 60.

The other organization and effects are same as in the first embodiment, and are omitted here.

Figure 8:
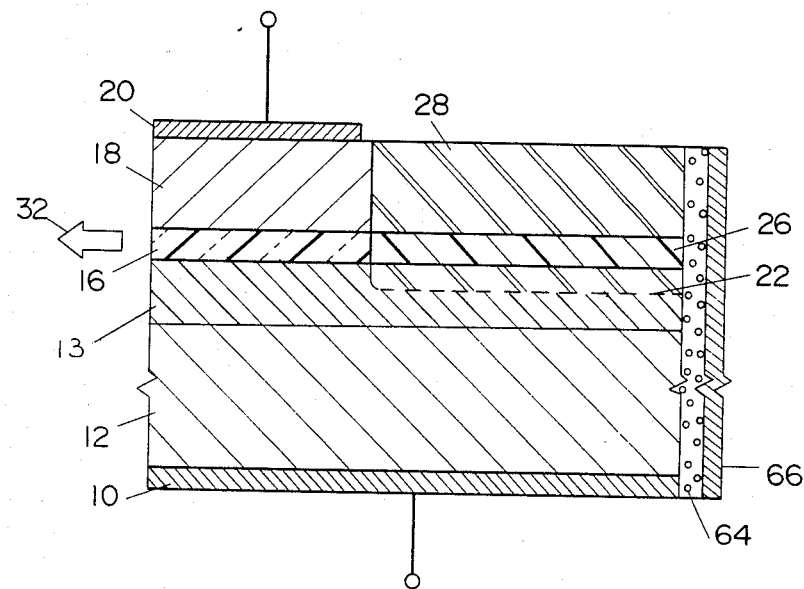
FIG. 8 is a sectional view of a semiconductor device in a third embodiment of this invention.

A third embodiment of this invention is then explained in FIG. 8. This is a sectional view of a Fabry-Perot type optical feedback semiconductor laser composed of InP material. In the following explanation, the same numerals are given to the same parts as used in the above description of the embodiments and the verbal expressions are omitted.

In FIG. 8, the numeral 64 is a dielectric layer of a silicon nitride film formed by a sputtering method, and numeral 66 is a metal layer of Au formed by evaporation. Part of the light leaving the MQW active layer 16 is coupled with the waveguide layer 26 at high efficiency, and propagates through the waveguide layer 26 at low loss, and is nearly completely reflected by the dielectric layer 64 and the metal layer 66, and is fed back to the MQW active layer 16 in the same route. As a result, a large light feedback effect may be easily obtained, and an optical feedback type semiconductor laser oscillation possessing excellent characteristics may be obtained. Incidentally, this device had a single longitudinal mode oscillation, and was stabilized in the spectral linewidth at less than 1 MHz. Moreover, there was no fluctuation in characteristics among devices, and every device oscillated at a low threshold current.

Figure 9:
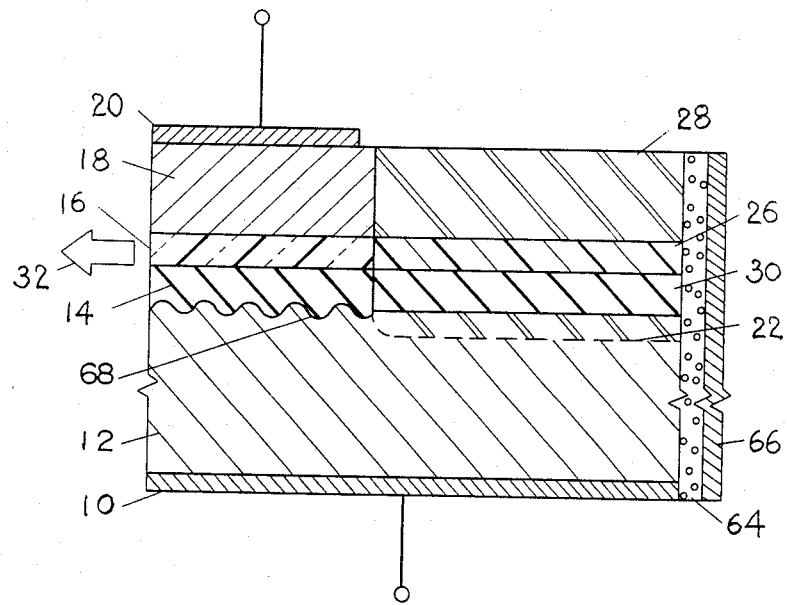
FIG. 9 is a sectional view of a semiconductor device in a fourth embodiment of this invention.

A fourth embodiment of this invention is now described in FIG. 9. This is a sectional structural diagram of a light feedback type semiconductor laser of a distributed feedback (DFB) type composed of an InP material. Numeral 68 is a similar grating as explained with numeral 24 in FIG. 1. FIG. 9 shows one example of a device in which a grating is formed directly on the substrate 10 without the buffer layer 13. Part of the laser beam oscillated in the region of the MQW active layer 16 is coupled with the waveguide 26 at high efficiency, and propagates through the waveguide 26 at low loss, and is nearly completely reflected by the dielectric layer 64 and the metal layer 66, and is fed back to the MQW active layer 16 through the same route, so that a DFB type optical feedback semiconductor laser oscillation possessing a great optical feedback effect may be easily obtained. This device had a single longitudinal mode oscillation, and was always stable in the spectral linewidth at less than 1 MHz regardless of changes in the temperature or current. Having these excellent properties, these devices were uniform in characteristics and oscillated at a low threshold current.

Figure 10:
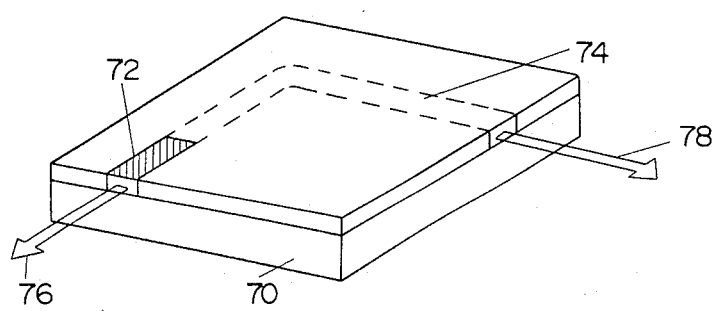
FIG. 10 is a sectional view of a semiconductor device in a fifth embodiment of this invention.

Finally, a fifth embodiment of this invention is explained below by referring to FIG. 10, which is a perspective view of the embodiment applying this invention in an OEIC (opto-electronics integrated circuit). In FIG. 10, the numeral 70 is a semiconductor substrate, 72 is a semiconductor laser device 74 is an optical waveguide formed on the basis of this invention, 76 is an output light from the semiconductor laser, and 78 is an output light from the optical waveguide.

In case of the OEIC (Opto-Electronic IC) including a plurality of devices, it is effective to use a semi-insulation substrate in order to improve the electric insulating characteristic between devices and to reduce the capacitance of the device. In the present invention, it fundamentally does not depend on the conductivity of substrate, but in using a semi-insulation substrate, the structure of the above-explained embodiments can be used as they are, if a first semiconductor layer on the substrate is one with p-type conductivity.

The light from the semiconductor laser device 72 is coupled with the optical waveguide 74 at high efficiency owing to the effect of this invention, and propagates through the optical waveguide 74 at low loss, which light may be connected to a modulator, a photo switch, an optical fiber or the like.

Meanwhile, in the above embodiments of this invention, InP semiconductor materials were mainly used, but other semiconductor materials may be also used, as shown in FIG. 6 and FIG. 7, such as GaAs/AlGaAs material, InAs, InAlAs, or other III–V group semiconductor mixed crystals, or II–VI group semiconductors, or others.

Similarly, the electrodes and gratings may be also fabricated by using other materials or in other methods.

Incidentally, for burying the laser into the resonator in the vertical direction, the buried heterostructure (BH) was employed in the embodiments, but other structures may be employed, such as a mass transport structure and ridge-waveguide structure.

The multilayer structure of dielectric layer and metal layer may be also made of other materials so far as proper reflectivity is guaranteed.

As a means of disordering the MQW layer, a high concentration diffusion of zinc (Zn) by vapor phase method was explained, but a similar effect will be obtained by high concentration diffusion of other impurities, high concentration ion implantation, or local annealing by laser beam or electron beam.

In the above-shown embodiments, the active layer of semiconductor laser device is formed by multiquantum well (MQW) layer or single-quantum well (SQW) layer. This MQW layer or SQW layer is composed of a thin film multilayer structure of alternate repetitions of well layers and barrier layers of about 20 to 200 Å in thickness. When this MQW layer or SQW layer is disordered by a high concentration impurity doping or local annealing, the band gap is widened, and the absorbing end is shifted to the higher energy side, so that an excellent low loss optical waveguide layer with almost no absorption loss in the band gap with respect to the output light from the semiconductor laser may be obtained. In addition, the thus formed optical waveguide is equal in the film thickness to the active layer of the semiconductor laser and is also matched in the optical axis, so that a high efficiency coupling of light may be achieved between the semiconductor laser and the optical waveguide.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What we claim is:

1. A monolithic integrated semiconductor device of a semiconductor laser and an optical waveguide comprising:

a semiconductor substrate;

a first semiconductor optical waveguide layer disposed on said semiconductor substrate;

a semiconductor active layer of a quantum well structure disposed on said first semiconductor waveguide layer;

a semiconductor cladding layer disposed on said semiconductor active layer; and a second semiconductor waveguide layer made by disordering a part of said semiconductor active layer.

2. A monolithic integrated semiconductor device of claim 1, wherein said disordering is carried out by use of a doping impurity of high concentration.

3. A monolithic integrated semiconductor device of claim 1, wherein said disordering is carried out by local annealing.

4. A monolithic integrated semiconductor device of claim 1, wherein a grating is formed in the surface of said semiconductor substrate, at least at the portion corresponding to said second semiconductor waveguide layer.

5. A monolithic integrated semiconductor device of claim 1, wherein a grating is formed in the surface of said semiconductor substrate, at least at the portion corresponding to said semiconductor active layer.

6. A device according to claim 2, wherein the doping impurity is Zn.

* * * * *